(12) United States Patent
Lin

(10) Patent No.: US 10,818,371 B2
(45) Date of Patent: Oct. 27, 2020

(54) DATA STORAGE DEVICES AND DATA PROCESSING METHODS

(71) Applicant: Silicon Motion, Inc., Jhubei (TW)

(72) Inventor: Wen-Sheng Lin, Kaohsiung (TW)

(73) Assignee: Silicon Motion, Inc., Hsinchu County (TW)

(*) Notice: Subject to any disclaimer, the term of this patent is extended or adjusted under 35 U.S.C. 154(b) by 0 days.

(21) Appl. No.: 16/518,615

(22) Filed: Jul. 22, 2019

(65) Prior Publication Data
US 2020/0075114 A1 Mar. 5, 2020

(30) Foreign Application Priority Data
Sep. 3, 2018 (TW) .............................. 107130822 A

(51) Int. Cl.
| | | |
|---|---|---|
| G11C 29/12 | (2006.01) | |
| G11C 16/08 | (2006.01) | |
| G06F 11/07 | (2006.01) | |
| G06F 3/06 | (2006.01) | |
| G11C 16/28 | (2006.01) | |

(52) U.S. Cl.
CPC ............ *G11C 29/12* (2013.01); *G06F 3/0619* (2013.01); *G06F 3/0653* (2013.01); *G06F 3/0679* (2013.01); *G06F 11/076* (2013.01); *G11C 16/08* (2013.01); *G11C 16/28* (2013.01); *G11C 2029/1202* (2013.01)

(58) Field of Classification Search
CPC .. G06F 3/064; G06F 11/1048; G06F 11/1012; G06F 11/1068; G11C 29/52; G11C 5/148; G11C 16/225; G11C 16/349; G11C 5/143; G11C 16/30
See application file for complete search history.

(56) References Cited

U.S. PATENT DOCUMENTS

| | | | |
|---|---|---|---|
| 8,661,301 B1 | 2/2014 | Yen | |
| 9,520,191 B2* | 12/2016 | Moshayedi | ........... G06F 3/0634 |
| 9,721,669 B2 | 8/2017 | Chu | |
| 10,007,451 B2 | 6/2018 | Zhang et al. | |
| 10,732,855 B2* | 8/2020 | Hashimoto | ......... G06F 12/0246 |
| 2010/0202240 A1* | 8/2010 | Moshayedi | ............ G11O 5/147 |
| | | | 365/229 |
| 2013/0039141 A1* | 2/2013 | Smith | ................. G06F 11/1048 |
| | | | 365/228 |
| 2019/0065361 A1 | 2/2019 | Liao et al. | |

FOREIGN PATENT DOCUMENTS

| | | |
|---|---|---|
| TW | I470433 B | 1/2015 |
| TW | I554886 B | 10/2016 |
| TW | I626541 B | 6/2018 |

* cited by examiner

*Primary Examiner* — Gene N Auduong
(74) *Attorney, Agent, or Firm* — Winston Hsu

(57) ABSTRACT

A data storage device includes a memory controller and a memory device. The memory device includes a current memory block. The memory controller is coupled to the memory device and configured to access the memory device. In response to detection of a sudden power-off that has occurred before the memory device is powered up, the memory controller is configured to find a last valid page and a last valid word line corresponding to the last valid page by scanning a plurality of pages in the current memory block, and determine whether to use one or more empty pages belonging to a word line group that is the same as that of the last valid page according to a read count and an erase count of the current memory block.

15 Claims, 7 Drawing Sheets

| SB0 | | SB1 | | SB2 | | SB3 | | SB4 | | SB5 | | SB6 | | SB7 | |
|---|---|---|---|---|---|---|---|---|---|---|---|---|---|---|---|
| UP | LP | UP | LP | UP | LP | UP | LP | UP | LP | UP | LP | UP | LP | UP | LP |
| 17 | 16 | 19 | 18 | 21 | 20 | 23 | 22 | 25 | 24 | 27 | 26 | 29 | 28 | 31 | 30 |
| | | | | | | | | | | | | | | | |
| | | | | | | | | | | | | | | | |
| | | | | | | | | | | | | | | | |

FIG. 4A

▨ Programmed page    ▩ UECC page    ☐ Dummy programmed page

|     | SB0 |     | SB1 |     | SB2 |     | SB3 |     | SB4 |     | SB5 |     | SB6 |     | SB7 |
| --- | --- | --- | --- | --- | --- | --- | --- | --- | --- | --- | --- | --- | --- | --- | --- |
| UP | LP | UP | LP | UP | LP | UP | LP | UP | LP | UP | LP | UP | LP | UP | LP |
| 17 | 16 | 19 | 18 | 21 | 20 | 23 | 22 | 25 | 24 | 27 | 26 | 29 | 28 | 31 | 30 |

FIG. 5A

Programmed page    Dummy programmed page    Rewritten page

| SB0 | | SB1 | | SB2 | | SB3 | | SB4 | | SB5 | | SB6 | | SB7 | |
|---|---|---|---|---|---|---|---|---|---|---|---|---|---|---|---|
| UP | LP | UP | LP | UP | LP | UP | LP | UP | LP | UP | LP | UP | LP | UP | LP |
| 17 | 16 | 19 | 18 | 21 | 20 | 23 | 22 | 25 | 24 | 27 | 26 | 29 | 28 | 31 | 30 |
| 33 | 32 | 35 | 34 | 37 | 36 | 39 | 38 | | | | | | | | |

Legend: Programmed page ▨ | Dummy programmed page (stippled) | Rewritten page (bold box)

FIG. 5B

DATA STORAGE DEVICES AND DATA PROCESSING METHODS

CROSS REFERENCE TO RELATED APPLICATIONS

This Application claims priority of Taiwan Patent Application No. 107130822, filed on Sep. 3, 2018, the entirety of which is incorporated by reference herein.

BACKGROUND OF THE INVENTION

Field of the Invention

The invention relates to a data storage device and a data processing method, which are capable of speeding up a sudden power-off recovery (SPOR) procedure initiated after the data storage device underwent a sudden power-off by significantly reducing the number of pages that have to be checked, dummy programmed, and moved in the SPOR procedure.

Description of the Related Art

With the rapid growth of data storage technology in recent years, many data storage devices—such as memory cards manufactured in compliance with the SD/MMC standards, CF standards, MS standards or XD standards, as well as solid state hard drives, Embedded Multi Media Cards (eMMC) and Universal Flash Storage (UFS)—have been used widely for a variety of purposes. Therefore, effective control of access to these data storage devices is an important issue.

Generally, if a sudden power-off (SPO) occurs during the programming of a flash memory device, the data being written into the memory device at the time of the power-off, or data that has already been written into the memory device, may be damaged. For example, when a flash memory device undergoes an SPO while programming some memory block (that is, the memory block currently used for receiving data, hereinafter called the current memory block), the current memory block may be damaged.

Therefore, when the flash memory device is powered up again, a recovery procedure, such as a Sudden Power-Off Recovery (SPOR) procedure, will usually be performed, to scan the content stored in the current memory block page by page, so as to search for the location of the last valid page and the location of any pages that may possibly have been damaged, and to try to repair the damaged pages.

However, sometimes the effect of the SPO attack further spreads to the pages belonging to a word line group that is the same as the word line group of the page being attacked directly by the SPO. In this manner, it becomes hard to determine whether the pages belonging to the same word line group can still be used in the subsequent programming procedure.

In view of this, a data processing method for effectively determining whether or not the memory controller can still use the pages belonging to the same word line group and which data recovery method should be adopted is proposed. The proposed method significantly reduces the number of pages that have to be checked, dummy programmed, and moved in the SPOR procedure, thereby speeding up the SPOR procedure.

BRIEF SUMMARY OF THE INVENTION

Data storage devices and data processing methods are provided. An exemplary embodiment of a data storage device comprises a memory controller and a memory device. The memory device includes a current memory block. The memory controller is coupled to the memory device and configured to access the memory device. In response to detection of a sudden power-off that has occurred before the memory device is powered up, the memory controller is configured to find a last valid page and a last valid word line corresponding to the last valid page by scanning a plurality of pages in the current memory block, and determine whether to use one or more empty pages belonging to a word line group that is the same as that of the last valid page according to a read count and an erase count of the current memory block.

An exemplary embodiment of a data processing method for a data storage device, wherein the data storage device comprises a memory device and a memory controller, the memory device comprises a plurality of memory blocks, the memory blocks comprise a current memory block, the memory controller is coupled to the memory device and is configured to access the memory device, the method is performed by the memory controller and comprises: in response to detection of a sudden power-off that has occurred before the memory device is powered up, scanning a plurality of pages comprised in the current memory block to find a last valid page and a last valid word line corresponding to the last valid page; and determining whether to use one or more empty pages belonging to a word line group that is the same as that of the last valid page according to a read count and an erase count of the current memory block.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4A is an exemplary memory block for showing a word line group and the word lines and pages comprised in this word line group according to an embodiment of the invention;

FIG. 5A is another exemplary memory block for showing a word line group and the word lines and pages comprised in this word line group according to an embodiment of the invention; and FIG. 5B is another exemplary memory block for showing a word line group and the word lines and pages comprised in this word line group according to an embodiment of the invention.

DETAILED DESCRIPTION OF THE INVENTION

In order to make the objects, features and advantages of the invention more comprehensible, specific embodiments of the invention are set forth in the accompanying drawings.

This description is made for the purpose of illustrating the general principles of the invention and should not be taken in a limiting sense. It should be understood that the following embodiments can be implemented by software, hardware, firmware, or any combination thereof. The scope of the invention is determined by reference to the appended claims.

Figure 1:
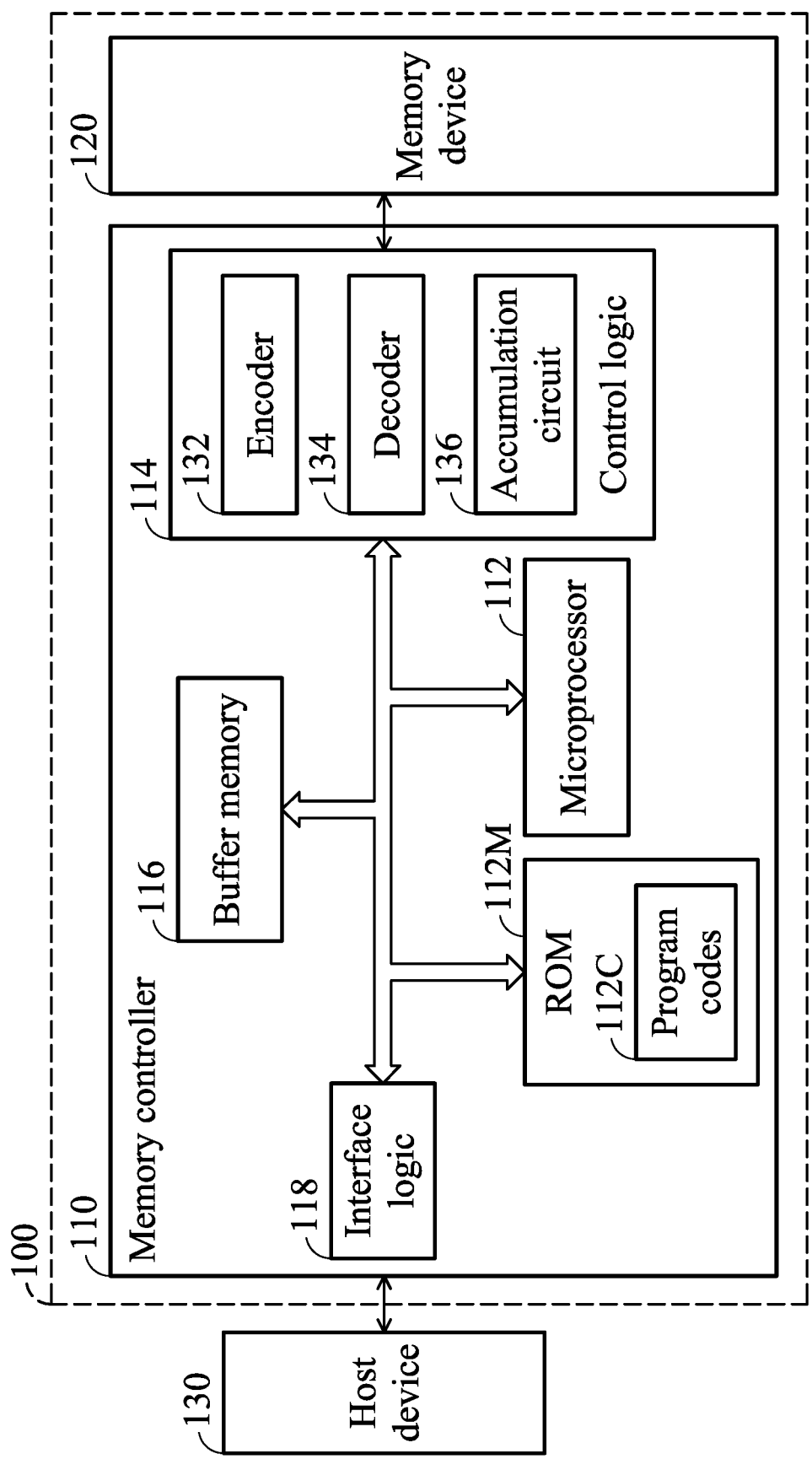
FIG. 1 shows an exemplary block diagram of a data storage device according to an embodiment of the invention.

FIG. 1 shows an exemplary block diagram of a data storage device according to an embodiment of the invention. The data storage device 100 may comprise a memory device 120, such as a flash memory module, and a memory controller 110. The memory controller 110 is configured to access the memory device 120. According to an embodiment of the invention, the memory controller 110 may comprise a microprocessor 112, a Read Only Memory (ROM) 112M, a control logic 114, a buffer memory 116 and an interface logic 118. The ROM 112M is configured to store program codes 112C. The microprocessor 112 is configured to execute the program codes 112C, thereby controlling access to the memory device 120. The control logic 114 may comprise an encoder 132, a decoder 134 and an accumulation circuit 136. The encoder 132 is configured to encode the data to be written into the memory device 120 so as to generate corresponding correcting/checking code (also called error correction code (ECC)). The decoder 134 is configured decode the data read out from the memory device 120. The accumulation circuit 136 is configured to accumulate a number of a predetermined bit comprised in the pages, such as the number of bit '0' or bit '1' (which will be described in more detailed), provided as the basis for making some specific determinations.

Typically, the memory device 120 may comprise a plurality of flash memory chips, and each flash memory chip may comprise a plurality of memory blocks. The access unit of an erase operation performed by the controller (e.g., the memory controller 110, through the execution of the program codes 112C by the microprocessor 112) on the memory device 120 may be one memory block. In addition, a memory block may record (comprise) a predetermined number of pages, and the access unit of a write operation performed by the controller (e.g., the memory controller 110, through the execution of the program codes 112C by the microprocessor 112) on the memory device 120 may be one page.

In practice, the memory controller 110 may perform various control operations using its own internal components through the execution of the program codes 112C by the microprocessor 112. For example, the memory controller 110 may use the control logic 114 to control the access operations (especially the access operation for at least a memory block or at least a page) of the memory device 120, use the buffer memory 116 to perform necessary data buffer operations, and use the interface logic 118 to communicate with a host device 130. The buffer memory 116 may be implemented by a Random Access Memory (RAM). For example, the buffer memory 116 may be an SRAM, but the invention should not be limited thereto.

In an embodiment of the invention, the data storage device 100 may be a portable storage device (for example, the memory card in compliance with the SD/MMC, CF, MS and/or XD standard), and the host device 130 may be an electronic device, such as a mobile phone, a notebook computer, a desktop computer . . . etc., capable of connecting to the data storage device. In another embodiment of the invention, the data storage device 100 may be a solid state hard disk or an embedded storage device in compliance with the Universal Flash Storage (UFS) or the Embedded Multi Media Card (EMMC) standards, and may be equipped in an electronic device such as a mobile phone, a notebook computer, or a desktop computer. In such an embodiment, the host device 130 may be a processor of the electronic device.

The host device 130 may issue commands, such as the read command or the write command, to the data storage device 100, so as to access the data stored in the memory device 120, or the host device 130 may issue commands to further control or manage the data storage device 100.

According to an embodiment of the invention, the memory blocks comprised in the memory device 120 may be configured as the Single-Level Cell (SLC) memory blocks, the Multiple-Level Cell (MLC) memory blocks and/or the Triple-Level Cell (TLC) memory blocks. The memory cell of the SLC memory block is configured to store one bit data, the memory cell of the MLC memory block is configured to store two bits data, and the memory cell of the TLC memory block is configured to store three bits data.

According to an embodiment of the invention, each memory block may comprise a predetermined number of pages, where the page may be a logical page. Therefore, for the SLC memory block, the MLC memory block and the TLC memory block, the value of the predetermined number may be different. For example, the number of logical pages comprised in a TLC memory block may be triple of that comprised in an SLC memory block.

Figure 2:
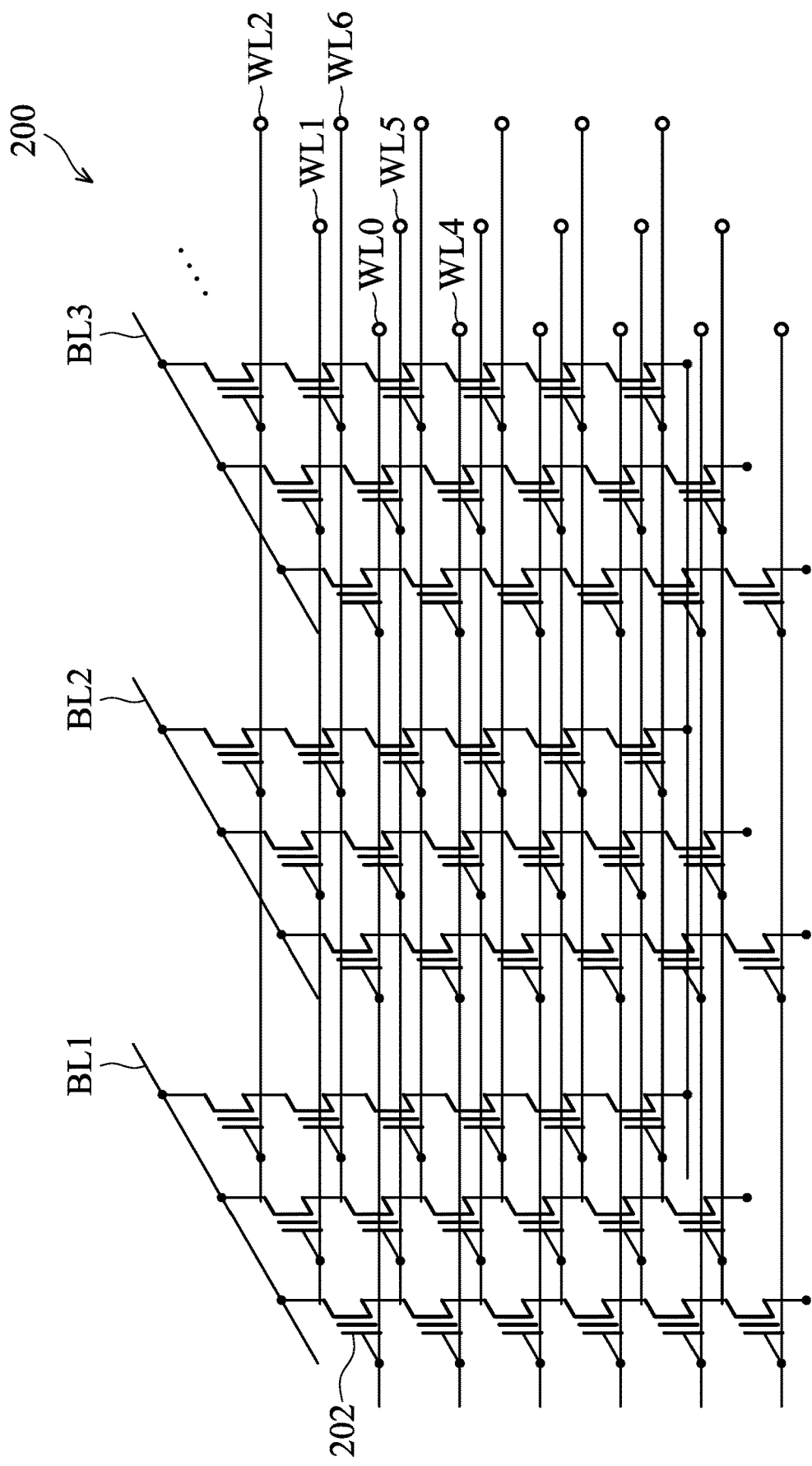
FIG. 2 is a schematic diagram of a memory block comprised in the memory device according to an embodiment of the invention.

FIG. 2 is a schematic diagram of a memory block comprised in the memory device according to an embodiment of the invention. In this embodiment, the memory device 120 may be a 3D NAND flash. As shown in FIG. 2, the memory block 200 may comprise a plurality of memory cells (such as the floating gate transistors 202 shown in FIG. 2 or other charge trap device), the structure of a 3D NAND flash is constructed by a plurality of bit lines (for simplicity, only the bit lines BL1-BL3 shown in FIG. 2) and a plurality of word lines (such as the word lines WL0-WL2 and WL4-WL6 shown in FIG. 2). In FIG. 2, take the top plane as an example, all the floating gate transistors on the word line WL0 form at least one page, all the floating gate transistors on the word line WL1 form at least another page, and all the floating gate transistors on the word line WL2 form at least yet another page, and so on. In addition, depending to different ways to program a flash memory, the definitions between the word line WL0 and the pages (logical pages) may be different. To be more specific, when the flash memory is programmed in an SLC manner, all the floating gate transistors on the word line WL0 correspond to a single logical page; when the flash memory is programmed in a MLC manner, all the floating gate transistors on the word line WL0 correspond to two logical pages; when the flash memory is programmed in a TLC manner, all the floating gate transistors on the word line WL0 correspond to three logical pages; and when the flash memory is programmed in a QLC manner, all the floating gate transistors on the word line WL0 correspond to four logical pages. Since the person having ordinary knowledge in the art should be able to understand the structure of the 3D NAND flash and the relationship between the word line and the pages, the details will not be described herein for brevity.

In the structure shown in FIG. 2, a plurality of word lines will be defined as a word line group, and a word line group may own a portion of control circuits that are commonly used. In this manner, when a program failure occurs when programming a floating gate transistor on a word line belonging to a word line group (for example, a program failure occurs due to the SPO attack), errors may be spread to the data stored in the floating gate transistors on the other word lines belonging to the same word line group. In an embodiment, the word lines on the same plane will belong to (be set to) one word line group. Referring to FIG. 2, suppose that there are four word lines on a plane, word lines WL0-WL3 will belong to a first word line group, word lines WL4-WL7 will belong to a second word line group, and so on. Suppose that the memory controller 110 is configured to write data to the floating gate transistors 202 on the word lines WL0, WL1, WL2 and WL3 sequentially when writing data to the pages of the first word line group. When the data is successfully written onto the word lines WL0, WL1 and WL2, but program failure occurs when writing data onto word line WL3, the data that has been successfully programmed onto the word lines WL0, WL1 and WL2 may be damaged. In addition, suppose that the memory controller 110 is configured to write data to the floating gate transistors 202 on the word lines WL4, WL5, WL6 and WL7 sequentially when writing data to the pages of the second word line group and suppose that some error occurs when writing data onto word line WL4, the word lines WL5, WL6 and WL7 may become unstable and unsuitable for further being programmed.

As described above, if a sudden power-off (SPO) occurs during the programming of a flash memory device, the data being written into the memory device at the time of the power-off or data that has already been written into the memory device may be damaged. Sometimes the effect of the SPO attack further spreads to the pages belonging to a word line group that is the same as the word line group having the page directly being attacked or affected by the SPO. In this manner, it is difficult for the memory controller to determine whether the remaining empty pages belonging to the same word line group can still be used.

To solve this problem, a data processing method performed by the memory controller to effectively determine whether the remaining empty pages belonging to the same word line group can still be used, and to determine which data recovery method should be adopted according to the extent of damage to the pages is proposed. By applying the proposed method, the number of pages that have to be checked, dummy programmed, and moved in the SPOR procedure can be significantly reduced, thereby speeding up the SPOR procedure.

According to an embodiment of the invention, when the data storage device 100 is powered up, the memory controller 110 may read some variables (for example, an SPO flag or an SPO count) from the memory device 120 so as to determine whether the SPO has occurred. The SPO count may be utilized to accumulate the number of occurrence of the SPO. When the SPO count increases, it means that the previous power off of the memory device 120 was caused by an SPO. In addition, the SPO flag may be utilized to indicate that whether the last power-off of the data storage device 100 was caused by the SPO. For example, when a value of the SPO flag is 1, it means that an SPO has occurred. When the value of the SPO flag is 0, it means that the last power-off of the memory device 120 was triggered by a normal power-off procedure. Every time that the data storage device 100 is powered up, the memory controller 110 may set the value of the SPO flag to 1 and store this value in the memory device 120. When the power-off of the memory device 120 was triggered by a normal power-off procedure, the memory controller 110 may set the value of the SPO flag to 0 during the normal power-off procedure and store this value in the memory device 120. Therefore, when the data storage device 100 is powered up again after the SPO, the value of the SPO flag will be 1.

When the memory controller 110 detects or determines that a sudden power-off has occurred before the memory device is powered up, the memory controller 110 may perform a corresponding recovery procedure, such as an SPOR. In the SPOR, the memory controller 110 may scan the content of data stored in the current memory block, page by page, so as to search for the location of the last valid page and the location of any pages that may possibly have been damaged. For example, the memory controller 110 may determine whether a page being searched is an empty page according to the content stored in a spare region or a data region of that page. For example, the memory controller 110 may determine whether the page being searched is an empty page or not according to whether the spare region thereof stores the corresponding metadata. If the content of the data stored in the spare region is a default value, for example, all bits are set to '1' (e.g. the value of 0XFFFFFFFF), the memory controller 110 may determine that this page is an empty page.

When programming the data storage device 100, the memory controller 110 sequentially writes data to the current memory block (that is, in the direction in which the indices of the pages increase). When a first empty page is found, the memory controller 110 may search backward (that is, in the direction in which the indices of the pages decrease) and read the data stored in the pages, so as to find the last valid page. In the embodiment of the invention, the term "valid page" refers to a page that does not contain any errors that cannot be corrected by the decoder 134 (that is, the valid page is not an UECC page which contains an Uncorrectable ECC error). It should be noted that the data storage device 100 may also use methods other than the method discussed above to find the last valid page. Therefore, the method to determine the last valid page should not be limited to the method discussed above.

According to an embodiment of the invention, the memory controller 110 may determine whether to use one or more empty pages belonging to a word line group that the last valid page also belongs to (corresponds to) according to the read count and the erase count of the current memory block. In the embodiments of the invention, the word line group may comprise a plurality of word lines, and each word line may constitute one or more pages. The number of word lines comprised in a word line group may be determined by the process adopted for manufacturing the memory device 120, and different processes may have different designs.

In addition, according to an embodiment of the invention, the memory controller 110 may further determine which data recovery method should be adopted according to the extent of damage to the pages (for example, whether any UECC page has been detected). In addition, according to an embodiment of the invention, when the memory controller 110 determines that the pages are relatively safe, the memory controller 110 may determine not to perform any further check, dummy program or data transfer (move), and only perform a small amount of dummy program and data transfer. In this manner, the SPOR procedure can be significantly sped up.

Figure 3:
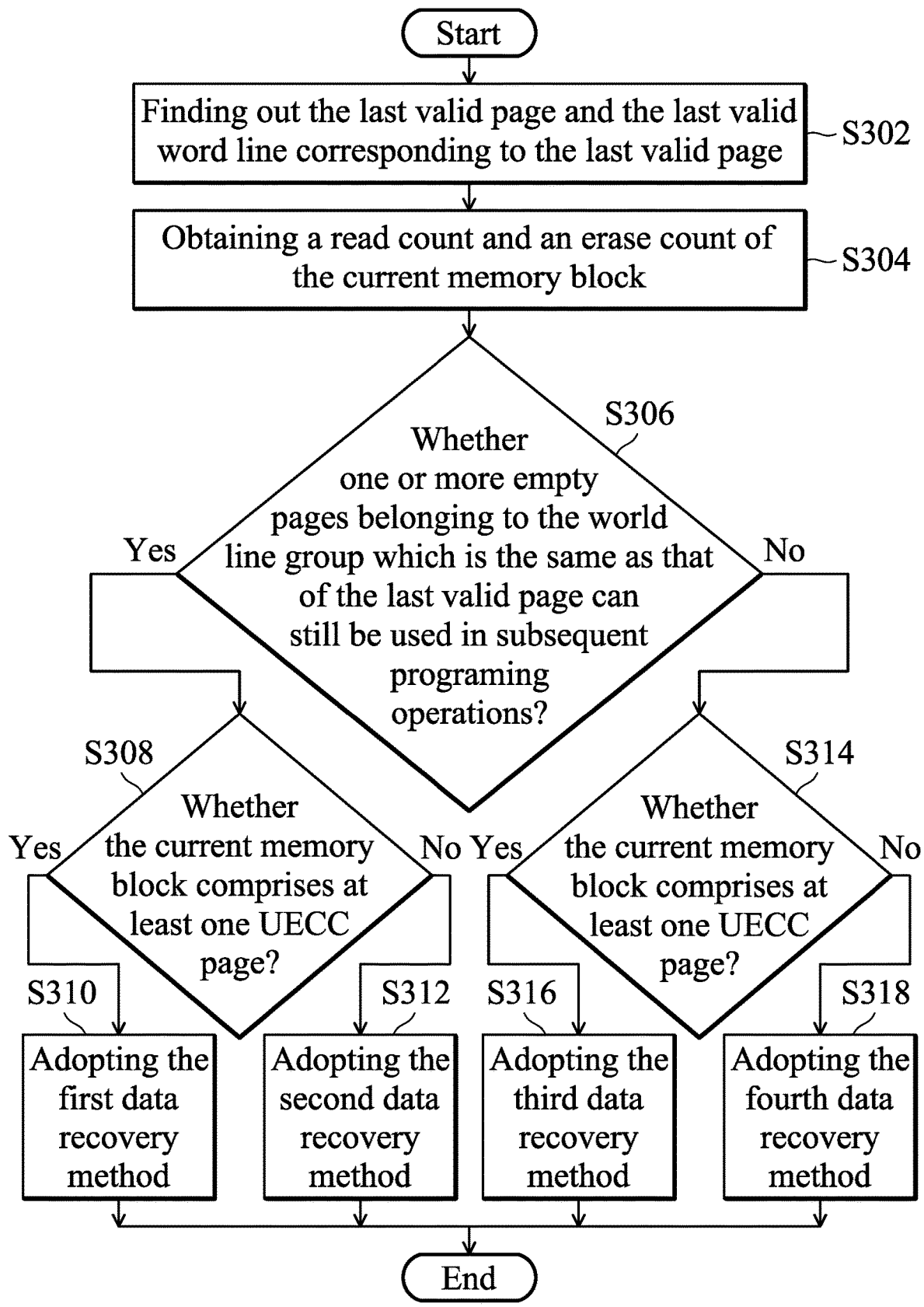
FIG. 3 is an exemplary flow chart of a data processing method according to an embodiment of the invention.

FIG. 3 is an exemplary flow chart of a data processing method according to an embodiment of the invention. First of all, in response to detection of an SPO that has occurred before the memory device 120 is powered up, the memory controller 110 is configured to find the last valid page and the last valid word line corresponding to the last valid page by scanning a plurality of pages comprised in the current memory block (Step S302). The scan operation may comprise reading the content of the pages and performing error checking and correction (ECC) on the programmed pages. Next, the memory controller 110 may obtain the read count and the erase count of the current memory block (Step S304). According to an embodiment of the invention, the read count and the erase count of a memory block may be recorded in a predetermined table stored in the memory device 120. When the data storage device 100/the memory device 120 is powered up, the memory controller 110 may read the predetermined table and stored that in the buffer memory 116. When the memory device 120 is accessed, the content of the predetermined table may be updated, accordingly. When the data storage device 100 is powered off, the content of the predetermined table may be stored back to the memory device 120.

Next, the memory controller 110 may determine whether to use one or more empty pages belonging to a word line group that is the same as that of the last valid page in subsequent programming operations according to the read count and the erase count of the current memory block (that is, the memory controller 110 is configured to determine whether one or more empty pages belonging to the same word line group can still be used in subsequent programming operations) (Step S306). It should be noted that hereinafter, the term "the same word line group" means that the word line group that is the same as that of the last valid page. In addition, it should be noted in step S306, the memory controller 110 may further perform a supplementary determination procedure to facilitate the memory controller 110 to determine whether to use the empty pages belonging to the same word line group.

When it is determined to use the remaining empty pages belonging to the same word line group, the memory controller 110 further determines whether the current memory block comprises at least one page which has Uncorrectable ECC Error (UECC error) (that is, data stored in the page comprises some error that cannot be corrected by the decoder 134) (Step S308).

When the current memory block comprises at least one UECC page, the memory controller 110 may determine to adopt a first data recovery method to repair the damaged pages (Step S310). According to an embodiment of the invention, the first data recovery method may comprise the processes of dummy programming a plurality of pages (for example, the UECC page and its paired page) corresponding to a word line adjacent to the last valid word line in the word line group, and continuing to use the remaining empty page(s) (if there is any). For example, the memory controller 110 may dummy program a page by writing dummy data, invalid data or a predetermined pattern to that page.

If the current memory block does not comprise any UECC page, the memory controller 110 may determine to adopt a second data recovery method (Step S312). According to an embodiment of the invention, the second data recovery method may comprise the processes of dummy programming a plurality of pages corresponding to a word line adjacent to the last valid word line in the word line group (for example, the pages corresponding to a word line that is next to the last valid word line), and continuing to use any remaining empty pages.

On the other hand, if the memory controller 110 determines not to use the remaining empty pages, the memory controller 110 may further determine whether the current memory block comprises at least one UECC page (Step S314).

When the current memory block comprises at least one UECC page, the memory controller 110 may determine to adopt a third data recovery method to repair any damaged pages (Step S316). According to an embodiment of the invention, the third data recovery method may comprise the process of dummy programming the pages from the UECC page and its paired page till the last empty page in the word line group (that is, any remaining empty pages that belong to the same word line group will also be dummy programmed).

If the current memory block does not comprise any UECC page, the memory controller 110 may determine to adopt a fourth data recovery method (Step S318). According to an embodiment of the invention, the fourth data recovery method may comprise the process of dummy programming the pages from the last valid page and its paired page till the last empty page belonging to the word line group (that is, any remaining empty pages belonging to the same word line group will also be dummy programmed).

Accompanying with the figures, the proposed methods (including the supplementary determination procedure) to determine whether to use the remaining pages and the above-mentioned four data recovery methods will be discussed in more detailed in the following paragraphs.

According to an embodiment of the invention, the memory controller 110 may determine whether to use the remaining empty pages or whether to perform the supplementary determination procedure to determine whether to use the remaining empty pages according to a summation of a weighted value of the read count and a weighted value of the erase count of the current memory block. The memory controller 110 may take the following strategies to make the determinations:

When a summation of the weighted value of the read count Read_Count (for example, Read_Count*y) and the weighted value of the erase count Erase_Count (for example, Erase_Count*x) is not greater than a first threshold value TH_1 (as the equation Eq. (1) shown below), the memory controller 110 may directly determine to continue to use one or more remaining empty pages belonging to the same word line group.

$$(\text{Erase\_Count}*x + \text{Read\_Count}*y) <= TH\_1 \qquad \text{Eq. (1)}$$

That is, when the equation Eq. (1) is satisfied, the memory controller 110 determines that the programmed pages and the empty pages comprised in (belonging to) the same word line group are relatively safe. Therefore, the memory controller 110 may determine to adopt the first data recovery method (when there is some UECC page detected) or the second data recovery method (when there no UECC page detected).

When the summation of the weighted value of the read count Read_Count (for example, Read_Count*y) and the weighted value of the erase count Erase_Count (for example, Erase_Count*x) is greater than a second threshold value TH_2 (as the equation Eq. (2) shown below), the memory controller 110 may directly determine not to use any remaining empty pages belonging to the same word line group.

$$(\text{Erase\_Count}*x + \text{Read\_Count}*y) > TH\_2 \qquad \text{Eq. (2)}$$

That is, when the equation Eq. (2) is satisfied, the memory controller 110 determines that the programmed pages and the empty pages comprised in (belonging to) the same word line group are relatively risky. Therefore, the memory controller 110 may determine to adopt the third data recovery method (when there is some UECC page detected) or the fourth data recovery method (when there no UECC page detected).

The weighting values x and y, the threshold values TH_1 and TH_2 may be designed according to the physical characteristics of the memory device and the process utilized for manufacturing the memory device.

When the summation of the weighted value of the read count Read_Count (for example, Read_Count*y) and the weighted value of the erase count Erase_Count (for example, Erase_Count*x) is greater than the first threshold value TH_1 and smaller than or equal to the second threshold value TH_2 (as the equation Eq. (3) shown below), the memory controller 110 may determine to perform a supplementary determination procedure to determine whether to use any remaining empty pages belonging to the word line group that is the same as that of the last valid page.

$$TH\_1 < (Erase\_Count*x + Read\_Court*y) <= TH\_2 \qquad \text{Eq. (3)}$$

In the supplementary determination procedure, the memory controller 110 may check the content of the data stored in any programmed pages comprised in the same word line group and/or check the content in any empty pages.

According to an embodiment of the invention, in the supplementary determination procedure, the memory controller 110 may further decode/check content of the data stored in the programmed pages comprised in the same word line group, so as to determine how many error bits have been detected in each of the programmed pages. When the number of error bits detected in any of the programmed pages is greater than an error bit threshold value, the memory controller determines that the programmed pages and the empty pages comprised in the word line group are relatively risky. Therefore, the memory controller 110 may determine not to use any remaining empty pages belonging to the word line group that is the same as that of the last valid page.

On the contrary, when the number of error bits detected in each programmed page is not greater than the error bit threshold value, the memory controller 110 may determine that the programmed pages and the empty pages comprised in (belonging to) the same word line group are relatively safe. Therefore, the memory controller 110 may determine that any remaining empty pages that belong to the same word line group can still be used.

According to another embodiment of the invention, in the supplementary determination procedure, the memory controller 110 may further decode/check content of the data stored in the programmed pages comprised in the same word line group, so as to obtain a retry level capable of successfully decoding content of the data stored in each programmed page. The retry level is a level of voltage provided by the memory controller 110 to the corresponding word line for reading data or the level of the error correction code parameter utilized by the decoder 134. Generally, the higher the retry level is, the greater effort is required to decode or perform error correction (for example, when the retry level is higher, the loading of computation should be higher or the range of adjustment should be wider). When the retry level of any of the programmed pages is greater than a retry level threshold value, the memory controller 110 determines that the programmed pages and any empty pages comprised in the same word line group are relatively risky. Therefore, the memory controller 110 may determine not to use any empty pages that belong to the same word line group.

On the contrary, when the retry level of each programmed page is not greater than the retry level threshold value, the memory controller 110 may determine that the programmed pages and the empty pages comprised in (belonging to) the same word line group are relatively safe. Therefore, the memory controller 110 may determine that the remaining empty pages belonging to the same word line group can still be used.

Besides checking the programmed pages, in the supplementary determination procedure, the memory controller 110 may further check whether the content in any empty pages comprised in the same word line group is a match with the default content. As an example, the memory controller 110 may start to check the content in the empty pages from the next two word line counted from the last valid word line (for example, the index of the last valid word line plus 2) (in the example shown in FIG. 4A and FIG. 4B, the memory controller 110 may start to check from the word line SB4, and in the example shown in FIG. 5A and FIG. 5B, the memory controller 110 may start to check from the word line SB5) and until the last empty page in the same word line group. Suppose that the content in the empty page is supposed to be a value with all bits set to '1' (e.g. 0XFFFF), the memory controller 110 may accumulate how many bit is set to '0' by using the accumulation circuit 136. When the number of the bit '0' comprised in any empty page is greater than an accumulated threshold value, the memory controller 110 may determine that the programmed pages and the empty pages comprised in (belonging to) the word line group are relatively risky. Therefore, the memory controller 110 may determine not to use the empty pages that belong to the same word line group.

On the contrary, when the number of the bit '0' comprised in each empty page is not greater than the accumulated threshold value, the memory controller 110 may determine that the programmed pages and the empty pages comprised in (belonging to) the same word line group are relatively safe. Therefore, the memory controller 110 may determine that any remaining empty pages that belong to the same word line group can still be used.

In the supplementary determination procedure, when the programmed pages and the empty pages in the word line group are determined as relatively risky based on any of the above-mentioned determination rules, the memory controller may determine not to use any empty pages belonging to the same word line group.

As discussed above, in step S306, when the memory controller 110 has determined whether to use one or more empty pages in the word line group based on the strategy discussed above, and the memory controller 110 may further determine which data recovery method should be adopted based on whether the current memory block comprises at least one UECC page.

It should be noted that, in the embodiment of the invention, when there is no empty page (for example, when the UECC page or the last valid page is the very last page in the word line group, or corresponds to the very last word line in the word line group), there is no need to consider whether to use any remaining empty pages of this word line group. The memory controller 110 may just determine which data recovery method should be adopted.

FIG. 4A is an exemplary memory block for showing a word line group and the word lines and pages comprised in this word line group according to an embodiment of the invention. The exemplary memory block in FIG. 4A is utilized for illustrating the first data recovery method adopted in step S310. In FIG. 4A, SB0-SB7 are the word lines, UP and LP are the pages corresponding to each word line. A word line group may comprise 8 word lines. Therefore, a word line group may comprise 16 contiguous pages. For example, the pages in each row may belong to (be comprised in, or correspond to) the same word line group. The pages in each column may belong to different word line groups. In the exemplary embodiment, the pages 16-31 correspond to the same word line group.

Suppose that in this exemplary embodiment, page 23 is the UECC page detected by the memory controller 110. In this manner, page 21 is the last valid page and word line SB2 is the last valid word line. Pages 16-22 are the programmed pages before page 23 and pages 24-31 are the empty pages after the page 23.

According to an embodiment of the invention, when the memory controller 110 detects that the current memory block comprises one or more UECC page and determines that the programmed pages and the empty pages in the word line group are relatively safe based on the strategy discussed above such that the memory controller 110 determines to continuous to use one or more empty pages in the word line group, the memory controller 110 may further determine to adopt the first data recovery method. In the first data recovery method, the memory controller 110 only gives up (or, discard) the UECC page and its paired page. Therefore, in this embodiment, the memory controller 110 only dummy programs pages 22 and 23 (which are the pages correspond to word line SB3 that is adjacent to the last valid word line SB2).

It should be noted that although in the embodiment shown in FIG. 4A, the memory block is programmed in the way as programming an MLC memory block, the invention should not be limited thereto. The proposed data processing method may also be applied in the memory block that is programmed in the way as programming a TLC memory block, a QLC memory block, or others.

Figure 4B:
FIG. 4B is another exemplary memory block for showing a word line group and the word lines and pages comprised in this word line group according to an embodiment of the invention.

FIG. 4B is another exemplary memory block for showing a word line group and the word lines and pages comprised in this word line group according to an embodiment of the invention. The exemplary memory block in FIG. 4B is utilized for illustrating the third data recovery method adopted in step S316. Suppose that in this exemplary embodiment, page 23 is the UECC page detected by the memory controller 110. In this manner, page 21 is the last valid page, word line SB2 is the last valid word line, pages 16-22 are the programmed pages before page 23 and pages 24-31 are the empty pages after the page 23.

According to an embodiment of the invention, when the memory controller 110 detects that the current memory block comprises one or more UECC page and determines that the programmed pages and the empty pages in the word line group are relatively risky based on the strategy discussed above such that the memory controller 110 determines not to use one or more empty pages in the word line group, the memory controller 110 may further determine to adopt the third data recovery method. In the third data recovery method, the memory controller 110 gives up (or, discard) the UECC page and its paired page, and determines not to use the remaining pages in this word line group. Therefore, in this embodiment, the memory controller 110 dummy programs the pages from page 22 till the last empty page: page 31.

In addition, the memory controller 110 may further move the data stored in the programmed pages in this word line group to the pages in a next word line group. To be more specific, the memory controller 110 may further read the data stored in the pages 16-21 out and perform error checking and correction (ECC) on the data. After the ECC, the checked (and corrected, if required) data will be sequentially rewritten into pages 32-37.

It should be noted that in this embodiment, if the UECC page detected by the memory controller 110 is page 30 or page 31, the memory controller 110 may only dummy program pages 30 and 31 and move the data stored in the programmed pages in this word line group to the pages in a next word line group.

In addition, it should be noted that although in the embodiment shown in FIG. 4B, the memory block is programmed in the way as programming an MLC memory block, the invention should not be limited thereto. The proposed data processing method may also be applied in the memory block that is programmed in the way as programming a TLC memory block, a QLC memory block, or others.

FIG. 5A is another exemplary memory block for showing a word line group and the word lines and pages comprised in this word line group according to an embodiment of the invention. The exemplary memory block in FIG. 5A is utilized for illustrating the second data recovery method adopted in step S312. Suppose that in this exemplary embodiment, there is no UECC page detected by the memory controller 110 in the current memory block. In this manner, page 23 is the last valid page, word line SB3 is the last valid word line, pages 16-22 are the programmed pages before page 23 and pages 24-31 are the empty pages after the page 23.

According to an embodiment of the invention, when the memory controller 110 detects no UECC page in the current memory block and determines that the programmed pages and the empty pages in the word line group are relatively safe based on the strategy discussed above such that the memory controller 110 determines to continuous to use one or more empty pages in the word line group, the memory controller 110 may further determine to adopt the second data recovery method. In the second data recovery method, since the memory controller 110 cannot ascertain which of the word lines SB3 and SB4 has undergone the SPO attack, the memory controller 110 may determine to move the data stored in the pages corresponding to the last valid word line SB3 to other empty pages and give up (or, discard) the pages corresponding to the word line SB4. To be more specific, the memory controller 110 may dummy program pages 24 and 25 corresponding to the word line SB4 next to the last valid word line SB3 and may further read the data stored in pages 22 and 23 out and perform ECC on the data. After the ECC, the checked (and corrected, if required) data will be sequentially rewritten into pages 26-27.

It should be noted that in this embodiment, if the last valid page is page 30 or page 31, the memory controller 110 may only move the data stored in the pages corresponding to the last valid word line SB7 to the empty pages in a next word line group.

In addition, it should be noted that although in the embodiment shown in FIG. 5A, the memory block is programmed in the way as programming an MLC memory block, the invention should not be limited thereto. The proposed data processing method may also be applied in the memory block that is programmed in the way as programming a TLC memory block, a QLC memory block, or others.

FIG. 5B is another exemplary memory block for showing a word line group and the word lines and pages comprised in this word line group according to an embodiment of the invention. The exemplary memory block in FIG. 5B is utilized for illustrating the fourth data recovery method adopted in step S318. Suppose that in this exemplary embodiment, there is no UECC page detected by the memory controller 110 in the current memory block. In this manner, page 23 is the last valid page, word line SB3 is the last valid word line, pages 16-22 are the programmed pages before page 23 and pages 24-31 are the empty pages after the page 23.

According to an embodiment of the invention, when the memory controller 110 detects no UECC page in the current memory block and determines that the programmed pages and the empty pages in the word line group are relatively risky based on the strategy discussed above such that the memory controller 110 determines not to use one or more empty pages in the word line group, the memory controller 110 may further determine to adopt the fourth data recovery method. In the fourth data recovery method, since the memory controller 110 cannot ascertain which of the word lines SB3 and SB4 has undergone the SPO attack, the memory controller 110 may determine to give up (or, discard) the pages corresponding to the word line SB4 and the remaining empty pages in the word line group, and to move the data stored in the programmed pages to the pages in a next word line group.

To be more specific, in this embodiment, the memory controller 110 may perform dummy program from the page 24 until the last empty page 31 in the same word line group. The memory controller 110 may further read the data stored in pages 16-23 out and perform ECC on the data. After the ECC, the checked (and corrected, if required) data will be sequentially rewritten into pages 32-39.

It should be noted that in this embodiment, if the last valid page is page 30 or page 31, the memory controller 110 may only move the data stored in the programmed pages to the empty pages in a next word line group.

In addition, it should be noted that although in the embodiment shown in FIG. 5B, the memory block is programmed in the way as programming an MLC memory block, the invention should not be limited thereto. The proposed data processing method may also be applied in the memory block that is programmed in the way as programming a TLC memory block, a QLC memory block, or others.

In the conventional designs, once the SPO occurs, the pages belonging to the same word line group as the page being attacked or possibly being attacked by the SPO should all be discarded. However, in the embodiments of the invention, when the read count and the erase count of the memory block are relatively low, the memory controller 110 may determine to continuous to use the remaining empty pages (if there is any) belonging to the same word line group. Therefore, compared to the conventional designs, excessive waste of the remaining space of the memory device can be avoided in the proposed data processing method. In addition, the number of pages that have to be dummy programmed due to the determination of discarding these pages and the amount of data has to be moved and rewritten can be greatly reduced.

In addition, in the proposed data processing method, by simply referring to the read count and the erase count of the memory block, the memory controller can easily determine whether to use the remaining empty pages (if there is any) belonging to the same word line group. Therefore, the number of pages that have to be checked can be greatly reduced. To be more specific, in step S306, if the equation (1) or (2) is satisfied, there is no need to perform the supplementary determination procedure. In this manner, the determination procedure can be simplified and the number of pages that have to be checked can be greatly reduced, thereby speeding up the SPOR procedure.

In addition, in the proposed data processing method, the memory controller 110 may flexibly determine which data recovery method should be adopted according to the extent of damage to the pages and the range (number) of the pages needed to be dummy programmed and/or the pages with the data needed to be moved and rewritten. In this manner, not only the most suitable data recovery method can be selected based on the extent of damage to the pages, but also the range (number) of the pages needed to be dummy programmed and/or the pages with the data needed to be moved and rewritten can be minimized, thereby further speeding up the SPOR procedure.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data storage device, comprising:
   a memory device, comprising a plurality of memory blocks, wherein the memory blocks comprise a current memory block; and
   a memory controller, coupled to the memory device and configured to access the memory device,
   wherein in response to detection of a sudden power-off that has occurred before the memory device is powered up, the memory controller is configured to find a last valid page and a last valid word line corresponding to the last valid page by scanning a plurality of pages comprised in the current memory block, and determine whether to use one or more empty pages belonging to a word line group that is the same as that of the last valid page according to a read count and an erase count of the current memory block.

2. The data storage device as claimed in claim 1, wherein when a sum of a weighted value of the read count and a weighted value of the erase count of the current memory block is not greater than a first threshold value, the memory controller determines to use the empty pages belonging to the word line group that is the same as that of the last valid page.

3. The data storage device as claimed in claim 1, wherein when a summation of a weighted value of the read count and a weighted value of the erase count of the current memory block is greater than a second threshold value, the memory controller determines not to use the empty pages belonging to the word line group that is the same as that of the last valid page.

4. The data storage device as claimed in claim 1, wherein when a summation of a weighted value of the read count and a weighted value of the erase count of the equal to a second threshold value, the memory controller determines to perform a supplementary determination procedure to determine whether to use the empty pages belonging to the word line group that is the same as that of the last valid page.

5. The data storage device as claimed in claim 4, wherein in the supplementary determination procedure, the memory controller is further configured to decode content of data stored in one or more programmed pages belonging to the word line group to determine how may error bits have been detected in each of the programmed pages, and wherein when a number of error bits detected in any of the programmed pages is greater than an error bit threshold value, the memory controller determines not to use the empty pages belonging to the word line group.

6. The data storage device as claimed in claim 4, wherein in the supplementary determination procedure, the memory controller is further configured to decode content of data stored in one or more programmed pages belonging to the word line group to obtain a retry level capable of successfully decoding content of the data stored in each programmed page, and wherein when the retry level of any of the programmed pages is greater than a retry level threshold value, the memory controller determines not to use the empty pages belonging to the word line group.

7. The data storage device as claimed in claim 1, wherein when the memory controller determines not to use the empty pages belonging to the word line group that is the same as that of the last valid page, the memory controller is configured to dummy program the empty pages until a last empty page belonging to the word line group.

8. The data storage device as claimed in claim 1, wherein when the memory controller determines to use the empty pages belonging to the word line group that is the same as that of the last valid page, the memory controller is configured to dummy program a plurality of pages corresponding to a word line adjacent to the last valid word line.

9. A data processing method for a data storage device, wherein the data storage device comprises a memory device and a memory controller, the memory device comprises a plurality of memory blocks, the memory blocks comprise a current memory block, the memory controller is coupled to the memory device and is configured to access the memory device, the method is performed by the memory controller and comprises:

in response to detection of a sudden power-off that has occurred before the memory device is powered up, scanning a plurality of pages comprised in the current memory block to find a last valid page and a last valid word line corresponding to the last valid page; and determining whether to use one or more empty pages belonging to a word line group that is the same as that of the last valid page according to a read count and an erase count of the current memory block.

10. The method as claimed in claim 9, wherein the step of determining whether to use one or more empty pages belonging to a word line group that is the same as that of the last valid page according to a read count and an erase count of the current memory block further comprises:

determining to use the empty pages belonging to the word line group that is the same as that of the last valid page when a summation of a weighted value of the read count and a weighted value of the erase count of the current memory block is not greater than a first threshold value.

11. The method as claimed in claim 9, wherein the step of determining whether to use one or more empty pages belonging to a word line group that is the same as that of the last valid page according to a read count and an erase count of the current memory block further comprises:

determining not to use the empty pages belonging to the word line group that is the same as that of the last valid page when a summation of a weighted value of the read count and a weighted value of the erase count of the current memory block is greater than a second threshold value.

12. The method as claimed in claim 9, wherein the step of determining whether to use one or more empty pages belonging to a word line group that is the same as that of the last valid page according to a read count and an erase count of the current memory block further comprises:

performing a supplementary determination procedure to determine whether to use the empty pages belonging to the word line group that is the same as that of the last valid page when a summation of a weighted value of the read count and a weighted value of the erase count of the current memory block is greater than a first threshold value and is smaller than or equal to a second threshold value.

13. The method as claimed in claim 12, wherein the step of performing the supplementary determination procedure further comprises:

decoding content of data stored in one or more programmed pages belonging to the word line group to determine how may error bits have been detected in each of the programmed pages; and determining not to use the empty pages belonging to the word line group when the number of error bits detected in any of the programmed pages is greater than an error bit threshold value.

14. The method as claimed in claim 12, wherein the step of performing the supplementary determination procedure further comprises:

decoding content of data stored in one or more programmed pages belonging to the word line group to obtain a retry level capable of successfully decoding content of the data stored in each programmed page; and determining not to use the empty pages belonging to the word line group when the retry level of any of the programmed pages is greater than a retry level threshold value.

15. The method as claimed in claim 9, further comprising:

dummy programming the empty pages until a last empty page belonging to the word line group when determining not to use the empty pages belonging to the word line group that is the same as that of the last valid page; and dummy programming a plurality of pages corresponding to a word line adjacent to the last valid word line when determining to use the empty pages belonging to the word line group that is the same as that of the last valid page.

* * * * *